(12) United States Patent
Dani et al.

(10) Patent No.: US 6,974,726 B2
(45) Date of Patent: Dec. 13, 2005

(54) SILICON WAFER WITH SOLUBLE PROTECTIVE COATING

(75) Inventors: Ashay A. Dani, Chandler, AZ (US); Gudbjorg H. Oskarsdottir, Chandler, AZ (US); Chris Matayabas, Jr., Chandler, AZ (US); Sujit Sharan, Chandler, AZ (US); Chris L. Rumer, Chandler, AZ (US); Beverly J. Canham, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/748,446

(22) Filed: Dec. 30, 2003

(65) Prior Publication Data

US 2005/0139962 A1  Jun. 30, 2005

(51) Int. Cl.⁷ .............................................. H01L 21/44
(52) U.S. Cl. .................. 438/114; 438/113; 438/458; 438/460; 438/462; 438/463; 438/465; 257/620
(58) Field of Search .................. 438/113–114, 458, 438/460, 462, 463, 465; 257/620

(56) References Cited

U.S. PATENT DOCUMENTS

| | | | |
|---|---|---|---|
| 5,286,343 A | 2/1994 | Hui | |
| 5,543,365 A | 8/1996 | Wills et al. | |
| 5,641,416 A * | 6/1997 | Chadha | 219/121.69 |
| 6,465,329 B1 | 10/2002 | Glenn | |
| 6,506,681 B2 | 1/2003 | Grigg et al. | |
| 6,777,250 B1 | 8/2004 | Nakajyo et al. | |
| 6,838,299 B2 | 1/2005 | Mulligan et al. | |
| 2002/0031899 A1 | 3/2002 | Manor | |
| 2003/0013233 A1 | 1/2003 | Shibata | |
| 2004/0110010 A1 | 6/2004 | Buchwalter et al. | |
| 2004/0112880 A1 | 6/2004 | Sekiya | |
| 2004/0121514 A1 | 6/2004 | Yoo et al. | |
| 2004/0188400 A1 | 9/2004 | Peng et al. | |
| 2005/0070095 A1 * | 3/2005 | Sharan et al. | 438/642 |

FOREIGN PATENT DOCUMENTS

| | | |
|---|---|---|
| EP | 0818818 | 1/1998 |
| JP | 04067650 | 3/1992 |
| JP | 05211381 | 8/1993 |
| JP | 2000-530747 | 8/2000 |
| JP | 2002055219 | 8/2000 |

OTHER PUBLICATIONS

H.S. Lehman et al., "Insulating Lateral Surfaces on Semiconductor Chips," IBM Technical Disclosure Bulletin, vol. 7, No. 12, May 1965, 2 pages.

* cited by examiner

*Primary Examiner*—Donghee Kang
(74) *Attorney, Agent, or Firm*—Blakely, Sokoloff, Taylor & Zafman LLP

(57) ABSTRACT

A silicon wafer has a plurality of integrated circuits terminated on a surface of the silicon wafer. The silicon wafer has a soluble protective coat on the surface of the silicon wafer. The coated silicon wafer may be processed by laser scribing. A solvent wash may be used to remove the soluble protective coat and debris from laser scribing. The coated silicon wafer may be saw cut after laser scribing. A flow of solvent may be provided during the saw cutting. The flow of solvent may be sufficient to remove at least a substantial portion of the soluble protective coat.

11 Claims, 3 Drawing Sheets

SILICON WAFER WITH SOLUBLE PROTECTIVE COATING

BACKGROUND OF THE INVENTION

Active electronic integrated circuits for microelectronic devices are typically fabricated by creating a large number of circuits in an array on a silicon wafer. The silicon wafer is typically a thin disk of silicon which undergoes a variety of processes to produce the active circuits in the silicon wafer.

After the active circuits are completely formed, the silicon wafer is separated into the individual integrated circuits in preparation for packaging. The individual circuits are sometimes referred to as "dice" or "dies" and the separating process is sometimes termed "dicing."

A variety of methods may be used to separate individual circuits on a silicon wafer. It is desirable that whatever method is used for separating the individual circuits that it not requires an excessive amount of space between adjacent circuits to accommodate the mechanical process of separation. Separation processes that allow adjacent circuits to be closer together allow a greater number of devices to be fabricated on a single silicon wafer and thereby reduce the cost per device.

One method of separating the circuits from a silicon wafer is by sawing with a thin abrasive saw. Because silicon wafers are brittle, particularly silicon wafers having a low dielectric constant (low K), the sawing tends to create chipping along the edges of the saw path or kerf. It is necessary to have a sufficient amount of separation between adjacent circuits so that this chipping does not damage the functional parts of the circuit.

Laser scribing may be used as part of the separating process. Laser scribing may be used to create a groove or other surface discontinuity along a line which may be subsequently sawed or broken to complete the separation process. Laser scribing may provide a relatively clean separation of the active circuits at the surface of the silicon wafer. Laser scribing in combination with subsequent sawing may protect the surface of the silicon wafer from the chipping that occurs in the sawing process.

The laser scribing process tends to produce debris that accumulates on the surface of the silicon wafer adjacent to the groove produced by the laser scribing process. This debris must be thoroughly removed to avoid failures in the subsequent packaging operations.

One method of packaging microelectronic circuits is the flip chip process. In flip chip packaging an array of solder balls or die bumps is created on the surface of the silicon wafer to provide a connection to the terminations of the active electronic circuitry. In a subsequent packaging process, the individual circuits are placed on a substrate with the die bumps between the active electronic circuitry and the substrate. By heating this assembly, a soldered connection can be created between a large number of points on the active silicon circuit and the substrate which provides for the external connections of the packaged microelectronic device.

Debris from laser scribing that settles on the die bumps or solder balls will prevent the solder from properly wetting during the process of attaching the silicon chip to the substrate. The failure to properly wet a solder connection may result in a defective device. Therefore, if laser scribing is used, it is necessary that all debris from the laser scribing operation be thoroughly removed from the silicon wafer prior to packaging.

DETAILED DESCRIPTION OF THE INVENTION

Figure 1:
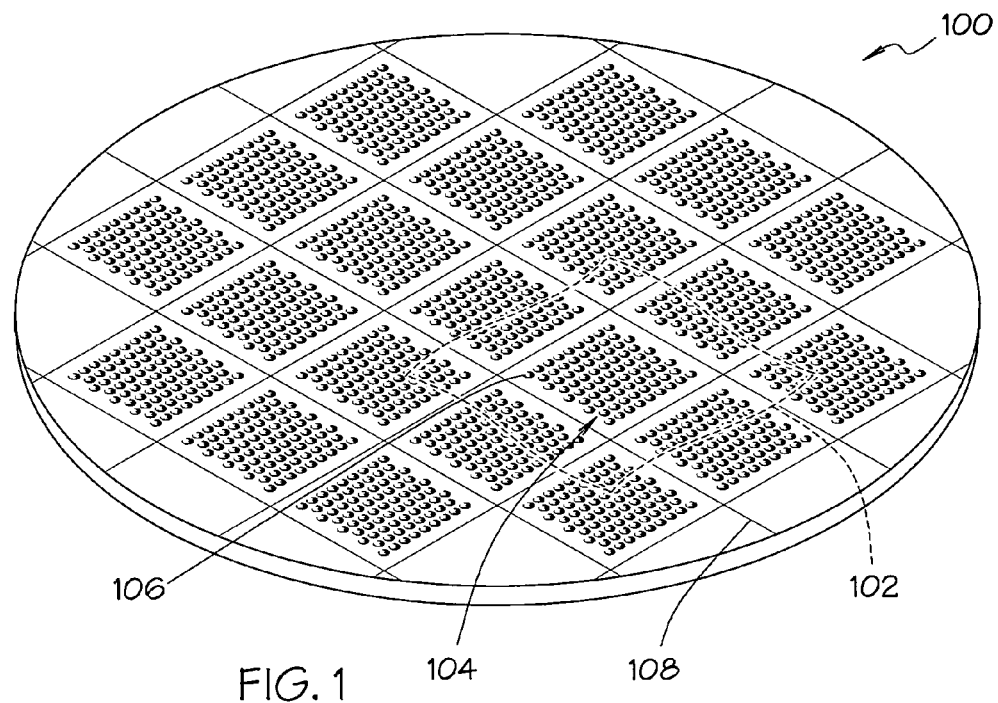
FIG. 1 is a pictorial view of a silicon wafer that includes an embodiment of the invention.

FIG. 1 shows a silicon wafer 100 that includes an embodiment of the invention. The silicon wafer 100 includes a plurality of integrated circuits 104 that are terminated on the shown surface of the silicon wafer. The integrated circuits 104 shown in FIG. 1 are terminated with an array of die bumps 106 which are raised bumps of solder to be used subsequently for attaching the integrated circuit to a substrate. The silicon wafer will be separated along the lines 108 that run between the adjacent integrated circuits 104.

It will be appreciated that the integrated circuits 104 are not shown to scale. A typical silicon wafer 100 includes many more integrated circuits 104 than shown in FIG. 1. It will also be appreciated that an integrated circuit 104 using die bumps 106 may have more or fewer bumps than shown on the integrated circuits 104 in FIG. 1 and that the die bumps may be in other configurations. It will also be appreciated that embodiments of the invention may be used with silicon wafers 100 and integrated circuits 104 using other types of terminations, either those already well known to those of ordinary skill in the art or forms of termination that may be developed in the future. Embodiments of the invention may be used with any type of terminations provided on the surface of the silicon wafer 100.

Figure 3:
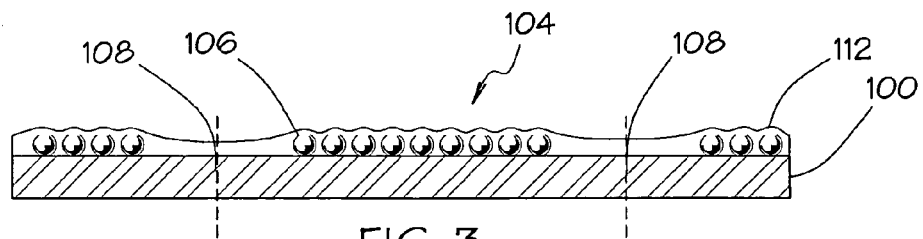
FIG. 3 is a cross-sectional view of a portion of the silicon wafer of FIG. 1.

The silicon wafer 100 is coated with a soluble protective coat 112 as best seen in FIG. 3. The protective coat 112 may cover the entire surface of the silicon wafer 100 or may be limited to the portion of the surface of the silicon wafer that includes the integrated circuits.

Figure 2:
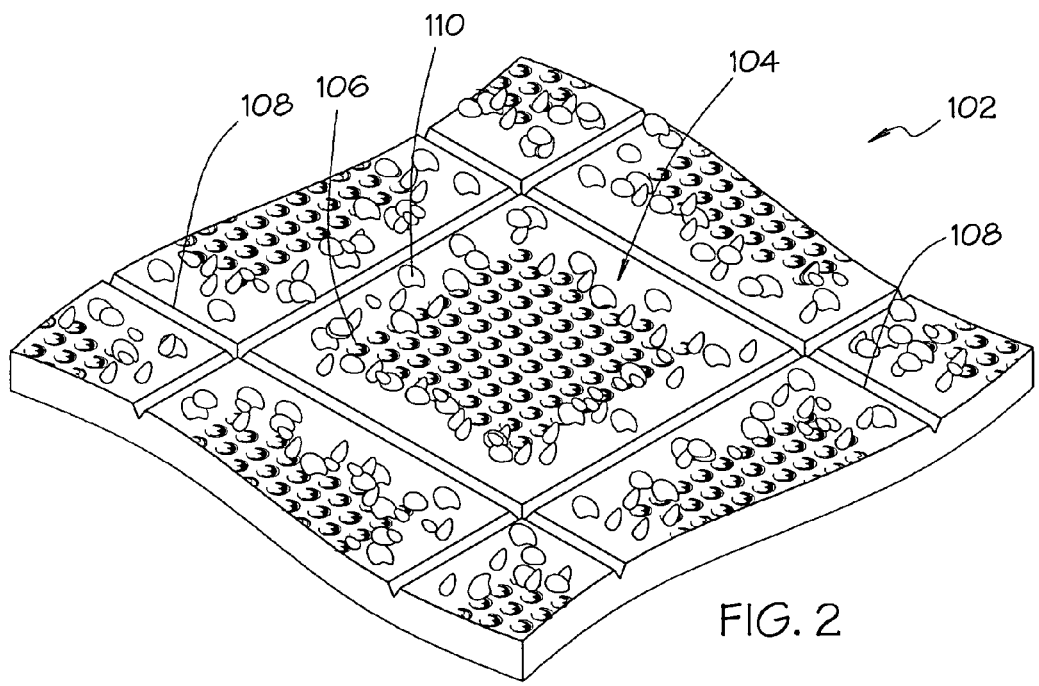
FIG. 2 is a pictorial view of a portion of the silicon wafer of FIG. 1 that has been laser scribed.

FIG. 2 shows a portion 102 of the silicon wafer 100 of FIG. 1. FIG. 2 illustrates the results of laser scribing which creates grooves 108 or other features or discontinuities on the surface of the silicon wafer 100 as part of the process of separating the integrated circuits from the silicon wafer. The laser scribing process creates debris 110 that settles on the surface of the silicon wafer, predominantly in the areas adjacent to the grooves 108. It will be appreciated that the debris 110 has been shown in FIG. 2 not to scale and much larger than the typical debris from laser scribing. Typical debris from laser scribing may be very much smaller than the die bumps and may be of the character of a fine powder.

Figure 4:
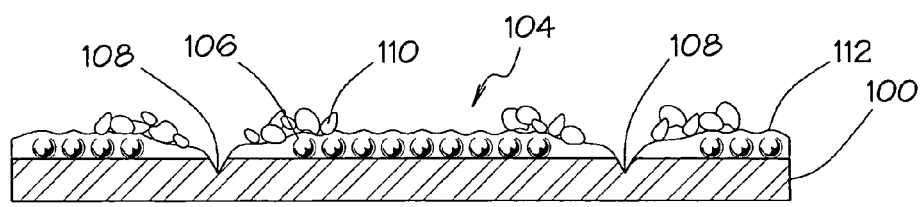
FIG. 4 is a cross-sectional view of the portion of the silicon wafer of FIG. 2.

As shown in FIG. 4 the laser scribing process may ablate the soluble protective coating 112 and a portion 108 of the silicon wafer 100 adjacent the surface of the wafer that includes the terminations 106. The debris 110 created by the laser scribing process may settle onto the surface of the soluble protective coat 112. Washing the surface of the silicon wafer 100 with an appropriate solvent to dissolve and wash away the soluble protective coat 112 may more reliably wash away the debris of the laser scribing than is possible with an unprotected silicon wafer.

The soluble protective coat 112 may be a flux, a film, a tape, a polymer or an organic solderability preservative. If the soluble protective coat 112 is a liquid material it may be applied by a variety of methods such as spraying, brushing, flow coating, or screen printing. It may be desirable to use a soluble protective coat 112 that is optically transparent so that fiducial marks or guidelines that appear on the surface of the silicon wafer 100 will be visible for alignment during the separation process. It may be desirable that the soluble protective coat 112 absorb laser energy such that the soluble protective coat will be ablated by the laser scribing along with a portion 108 of the silicon wafer 100 and thereby provide an exit path for the debris 110 of the laser scribing. It will be seen in FIG. 4 that the soluble protective coat 112 has been ablated along with a portion of the silicon wafer 100 adjacent the termination surface.

It may be particularly advantageous to use a flux as the soluble protective coat 112. Flux is typically used to clean surfaces immediately prior to a soldering operation. Flux materials are readily available that are compatible with the silicon wafer and the packaging processes used. The presence of residual flux following the washing of the surface of the silicon wafer 100 to remove the soluble protective coat 112 along with the debris 110 of the laser scribing will not normally be detrimental since there may be a subsequent application of flux and a flux removal process as part of the process of attaching the integrated circuit 104 to a substrate.

It may be desirable to use a water soluble flux. This will permit washing with water to remove the soluble protective coat. It may further be desirable to use a flux that can be removed with a water wash at room temperature. Senju 358 Flux Coating has been found to be a suitable flux for use as a soluble protective coat 112.

Figure 5:
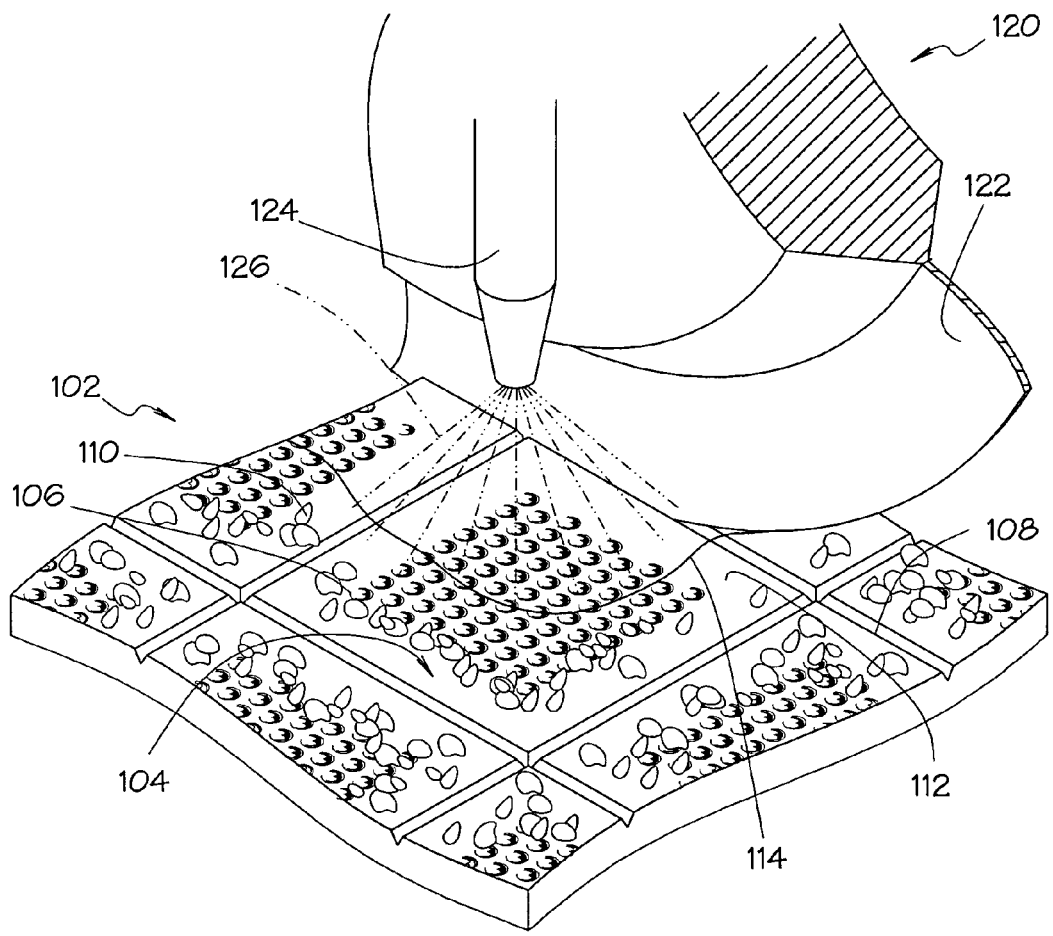
FIG. 5 is a pictorial view of the portion of the silicon wafer of FIG. 2 during a sawing process.

After laser scribing, the silicon wafer 100 may be saw cut to separate or singulate the integrated circuit dies 104 as shown in FIG. 5. A saw 120 that includes a thin abrasive blade 122 may be used to saw along the grooves 108 created by the laser scribing. The saw 120 may include one or more nozzles 124 that provide a spray or stream of fluid 126 during the sawing operation. The fluid 126 may be a solvent for the soluble protective coat 112. The action of the fluid 126 may wash away the soluble protective coat 112 along with the laser scribing debris 110 in the areas 114 adjacent to the fluid 126 flow.

The pressure, flow rate, temperature, and other parameters of the fluid flow 126 may be adjusted so that the fluid flow of the sawing process is sufficient to remove all or substantially all of the soluble protective coat 112 along with the debris 110 of the laser scribing. Removing substantially all of the soluble protective coat 112 is used to mean removal of enough of the soluble protective coat so as to reliably remove enough of the laser scribing debris 110 to reduce the incidence of part failures due to residual laser scribing debris to low levels that are consistent with other causes of parts failures.

Figure 6:
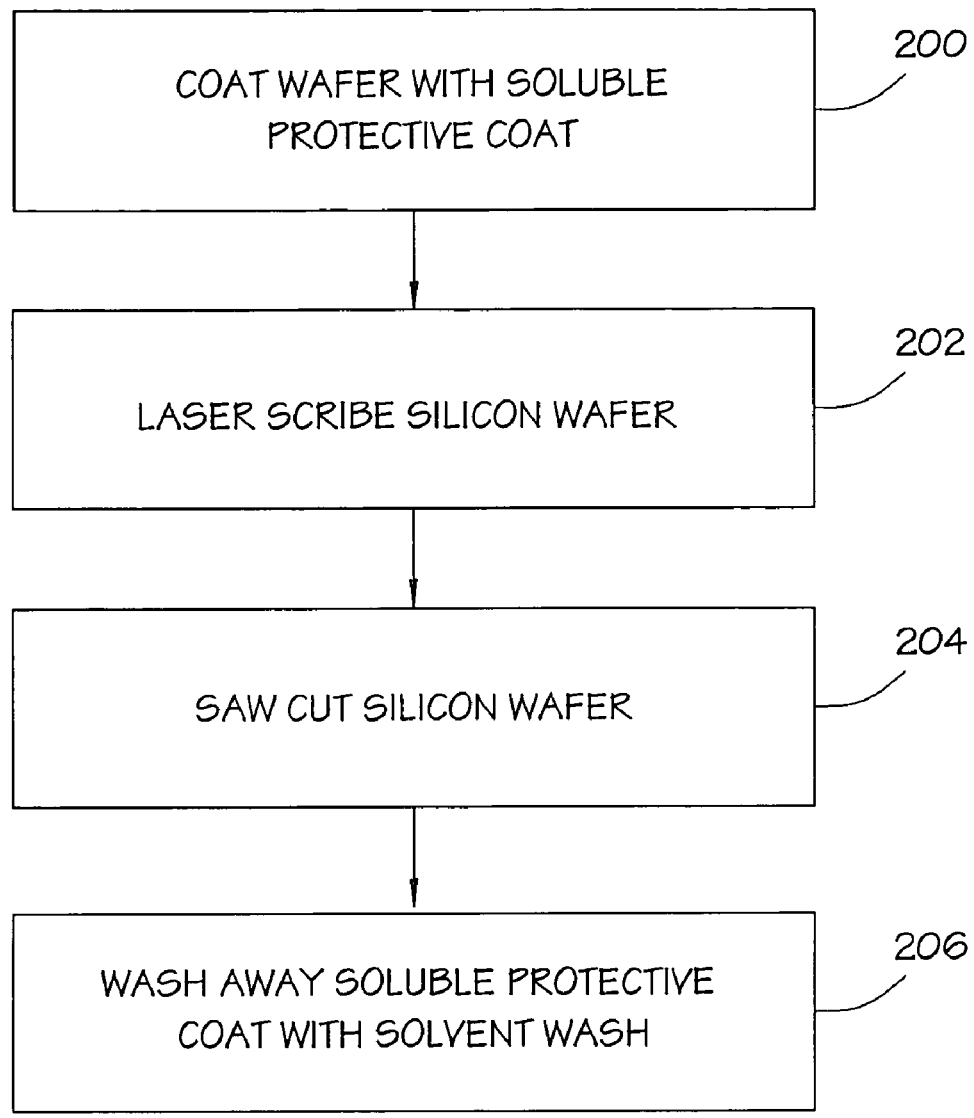
FIG. 6 is a flow chart for a method of separating a silicon wafer that includes an embodiment of the invention.

FIG. 6 is a flowchart for a method for separating a silicon wafer. A surface of the silicon wafer is coated with a soluble protective coat 200. The silicon wafer may include die bumps, in which case the soluble protective coat covers the die bumps. The soluble protective coat may be one of a flux, a film, a tape, a polymer, and an organic solderability preservative. The soluble protective coat may be optically transparent to allow fiducial marks or other markings on the surface of the silicon wafer to be seen during subsequent operations.

The coated surface of the silicon wafer is laser scribed 202. The soluble protective coat may be ablated by the laser scribing. The laser scribing may produce debris that settles on the soluble protective coat.

The silicon wafer may be separated by saw cutting 204. The silicon wafer is washed with solvent that washes away all or substantially all of the soluble protective coat along with the laser scribing debris 206. The saw cutting may be performed under a flow of solvent sufficient to remove at least a substantial portion of the soluble protective coat. If the soluble protective coat is not removed as part of a saw cutting operation, the silicon wafer may be washed with a solvent 206 as part of a separate operation. The solvent washing may precede the sawing. The soluble protective coat may be a water soluble flux in which case the solvent would be water. The water may be at room temperature or may be heated.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for separating a silicon wafer, the method comprising:
    coating a surface of the silicon wafer with a water soluble flux;
    laser scribing the coated surface of the silicon wafer; and
    saw cutting the silicon wafer under a flow of water at room temperature sufficient to remove at least a substantial portion of the water soluble flux.

2. The method of claim 1 further comprising washing the silicon wafer with a solvent.

3. The method of claim 1 wherein the silicon wafer includes die bumps and the coating includes coating the die bumps with the water soluble flux.

4. The method of claim 1 wherein the water soluble flux is optically transparent.

5. The method of claim 1 wherein the water soluble flux is ablated by the laser scribing.

6. A method for separating a silicon wafer, the method comprising:
    laser scribing the silicon wafer having a soluble protective coat, wherein the soluble protective coat is ablated by the laser scribing;
    saw cutting the silicon wafer after laser scribing; and
    providing a flow of water at room temperature during the saw cutting, the flow of water being sufficient to remove at least a substantial portion of the soluble protective coat.

7. The method of claim 6 wherein the soluble protective coat is one of a flux, a film, a tape, a polymer, and an organic solderability preservative.

8. The method of claim 6 wherein the soluble protective coat is a water soluble flux.

9. The method of claim 6 wherein the silicon wafer includes die bumps and the soluble protective coat covers the die bumps.

10. The method of claim 6 wherein the soluble protective coat is optically transparent.

11. The method of claim 6 wherein solvent is pressurized sufficiently to remove at least a substantial portion of the soluble protective coat.

* * * * *